(12) United States Patent
Nam

(10) Patent No.: US 6,765,252 B2
(45) Date of Patent: Jul. 20, 2004

(54) DRAM CELL HAVING INDEPENDENT AND ASYMMETRIC SOURCE/DRAIN AND METHOD OF FORMING THE SAME

(75) Inventor: Ki Bong Nam, Seoul (KR)

(73) Assignee: Hynix Semiconductor Inc., Kyoungki-do (KR)

(*) Notice: Subject to any disclaimer, the term of this patent is extended or adjusted under 35 U.S.C. 154(b) by 0 days.

(21) Appl. No.: 10/331,522

(22) Filed: Dec. 30, 2002

(65) Prior Publication Data

US 2003/0205745 A1 Nov. 6, 2003

(30) Foreign Application Priority Data

May 3, 2002 (KR) .................... 10-2002-0024330

(51) Int. Cl.[7] .............................................. H01L 29/72
(52) U.S. Cl. ................... 257/296; 257/298; 257/301; 257/305; 438/320
(58) Field of Search ...................... 257/296, 298, 257/301, 305; 438/320, 321

(56) References Cited

U.S. PATENT DOCUMENTS

| 5,886,540 | A | 3/1999 | Perez |
| 6,078,079 | A | 6/2000 | Ogoh |
| 6,147,405 | A | 11/2000 | Hu |
| 6,238,967 | B1 * | 5/2001 | Shiho et al. ............. 257/296 |
| 6,297,105 | B1 | 10/2001 | Guo |

* cited by examiner

Primary Examiner—Edward Wojciechowicz
(74) Attorney, Agent, or Firm—Ladas & Parry

(57) ABSTRACT

Disclosed are a DRAM cell having independent and asymmetric source/drain regions and a method of forming the same. The DRAM cell has an asymmetric structure in which source junctions are thick and drain junctions are thin. Therefore, the source/drain junctions have an asymmetric configuration via separate ion injection steps independent from each other, thereby preventing leakage current due to punch-through. Also, it is not necessary to form an ion injection layer for restraining punch-through, and a relatively low value of electric field is applied to the junctions to prolong refresh time. Further, the relatively thick spacer can be formed adjacent to the source regions thereby decreasing GIDL and further reducing electric field.

3 Claims, 5 Drawing Sheets

DRAM CELL HAVING INDEPENDENT AND ASYMMETRIC SOURCE/DRAIN AND METHOD OF FORMING THE SAME

BACKGROUND OF THE INVENTION

1. Field of the Invention

The present invention relates to a DRAM cell, and more particularly, to a DRAM cell having independent and asymmetric source/drain regions and a method of forming the same.

2. Description of the Prior Art

Recently, the interval between source and drain junctions is getting gradually smaller as the integrity of DRAM devices is exceeding 1-giga bytes. This creates leak current from the source junction to the drain junction due to punch-through while decreasing the electric potential difference between the source and drain junctions. Although ion injection is performed in order to restrain punch-through, excessive ion injection creates a high value of electric field to the junctions, thereby creating leakage current. Accordingly, it is difficult to obtain refresh time in such an amount necessary for the operation of a DRAM device.

FIG. 1 is a sectional view illustrating a structure of a DRAM cell of the prior art. Referring to FIG. 1, a conventional DRAM cell fabrication process includes: forming a device isolation film 11 in a proper area of a semiconductor substrate 10; injecting well ion; and forming an ion injection layer for preventing punch-through and a channel ion injection layer 13 for adjusting threshold voltage. After sequentially forming a gate oxide film 14, gates 15 and a hard mask layer 16, the conventional process forms a gate spacer 17, and source/drain junctions 20 and 21. Then, the conventional process includes forming contact plugs 18, which respectively contact with the source/drain junctions.

In the conventional fabrication process shown in FIG. 1, the gate-forming step is collectively performed using the gate mask once and the ion injection step for forming the source/drain junctions is also collectively performed without discrimination of the source junctions from the drain junctions. In particular, for the purpose of decreasing junction electric field and prolonging refresh time, source/drain ion injection is so performed with weight to the source junctions, which have a relatively more important function, that the junctions have a thick and circular lateral configuration.

However, because the drain junction 21 is also formed thick and wide as well as the source junctions 20, leakage current (as indicated with an arrow B in FIG. 1) takes place due to punch-through between the source/drain junctions thereby shortening refresh time. Although ion is injected to restrain punch-through, an ion injection layer 12 for restraining punch-through has a polarity value different from that of the source/drain junctions 20 and 21, thereby increasing electric field of the junctions (A in FIG. 1) to create resultant leakage current and further shorten refresh time.

SUMMARY OF THE INVENTION

Accordingly, the present invention has been made to solve the above-mentioned problems occurring in the prior art, and an object of the present invention is to provide a DRAM cell and a fabrication method thereof capable of ensuring refresh characteristics in a highly integrated DRAM cell transistor by realizing a source/drain structure which can remarkably decrease leakage current due to high electric field and punch-through between the source/drain junctions.

In order to accomplish this object, the present invention provides a DRAM cell having source/drain regions, which are separately formed to have an asymmetric structure via ion injection steps independent from each other.

According to an aspect of the invention for realizing the above objects, a DRAM cell comprises: a device isolation film for defining an active region on a semiconductor substrate; a well region formed inside the semiconductor substrate corresponding to the active region; a channel layer overlying the well region; a field stop layer underlying the well region; a plurality of gates on the semiconductor substrate; source and drain junctions respectively formed between the gates inside the semiconductor substrate, the source and drain junctions having an asymmetric junction structure; and contact plugs respectively contacting with the source and drain junctions. In particular, the source junctions are thick and the drain junction is thin so that they have an asymmetric configuration.

The DRAM cell comprise of the invention may further comprises source and drain spacers formed on upper and lateral faces of the gates, wherein the source spacer is thicker than the drain spacer, and selectively formed on the lateral faces of the gate adjacent to the source junctions. Also, the DRAM cell comprise of the invention may further comprise a channel layer overlying the well region and a field stop layer underlying the well region.

According to another aspect of the invention for realizing the above objects, a fabrication method of a DRAM cell comprises the following steps of: forming a device isolation film for defining an active region on a semiconductor substrate; forming a well region inside the semiconductor substrate corresponding to the active region; depositing gate material on a resultant structure and forming gates using a first gate mask, which selectively exposes portions of the resultant structure corresponding to source regions; removing the first gate mask and forming source junctions inside the semiconductor substrate so that the source junctions have a smooth and thick lateral configuration; selectively etching the gates using the second gate mask, which selectively exposes a portion of the resultant structure corresponding to a drain region, and forming a drain junction inside the semiconductor substrate so that the drain junction has a relatively thin lateral configuration compared to the source junctions; removing the second gate mask, depositing an interlayer insulation film, and selectively etching the interlayer insulation film to expose the source junctions and the drain junction; and forming contact plugs respectively contacting with the source junctions and the drain junction.

The fabrication method of a DRAM cell of the invention may further comprise the steps of: depositing a source spacer after the step of removing the first gate mask and forming source junctions; and depositing a drain spacer relatively thinner than the source spacer on the entire surface of a resultant structure after the step of removing the second gate mask, wherein the step of selectively etching the gates using the second gate mask comprises selectively etching the source spacer, and wherein the step of selectively etching the interlayer insulation layer comprises selectively etching the source spacer and the drain spacer, and after the step of forming the well region, forming the field stop layer at a proper depth inside the semiconductor substrate and a channel layer in the vicinity of the semiconductor substrate.

BRIEF DESCRIPTION OF THE DRAWINGS

The above and other objects, features and advantages of the present invention will be more apparent from the following detailed description taken in conjunction with the accompanying drawings, in which:

FIGS. 3 to 9 are sectional views illustrating a fabrication process of the DRAM cell shown in FIG. 2, in which:

FIG. 3 shows a step of forming a device isolation film;

FIG. 4 shows a step of injecting well ion;

FIG. 5 shows a step of forming first gates;

FIG. 6 shows a step of forming source junctions;

FIG. 7 shows a step of forming second gates and a drain junction; and

FIGS. 8 and 9 show steps for forming plugs.

DETAILED DESCRIPTION OF THE PREFERRED EMBODIMENTS

Figure 1:
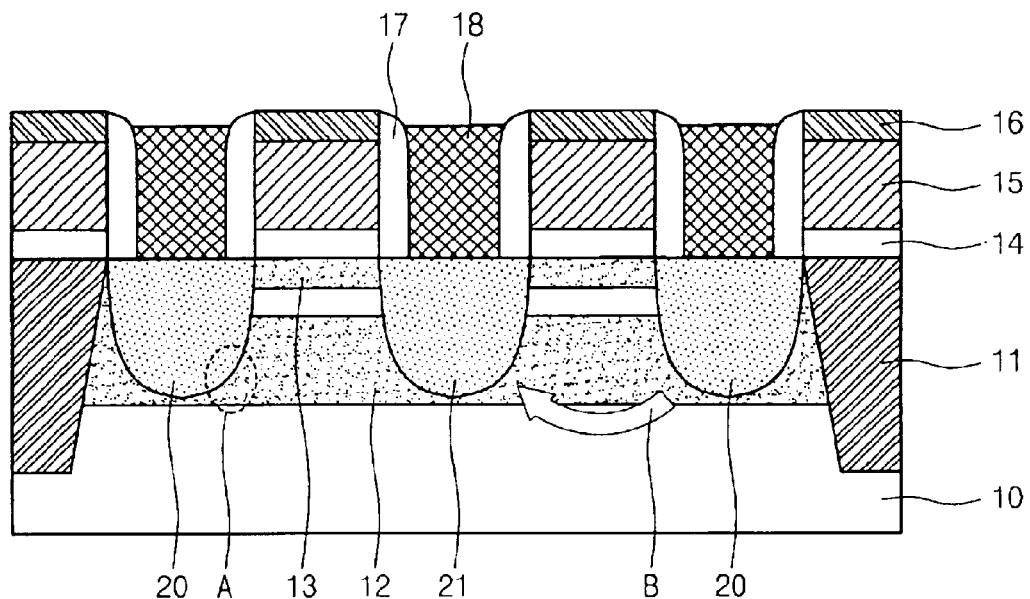
FIG. 1 is a sectional view illustrating a structure of a DRAM cell of the prior art.

Hereinafter, a preferred embodiment of the present invention will be described with reference to the accompanying drawings. In the drawings, and it shall be understood that some components may not entirely reflect actual sizes since they are more or less magnified or simplified in order to help clear understanding of the drawings.

Figure 2:
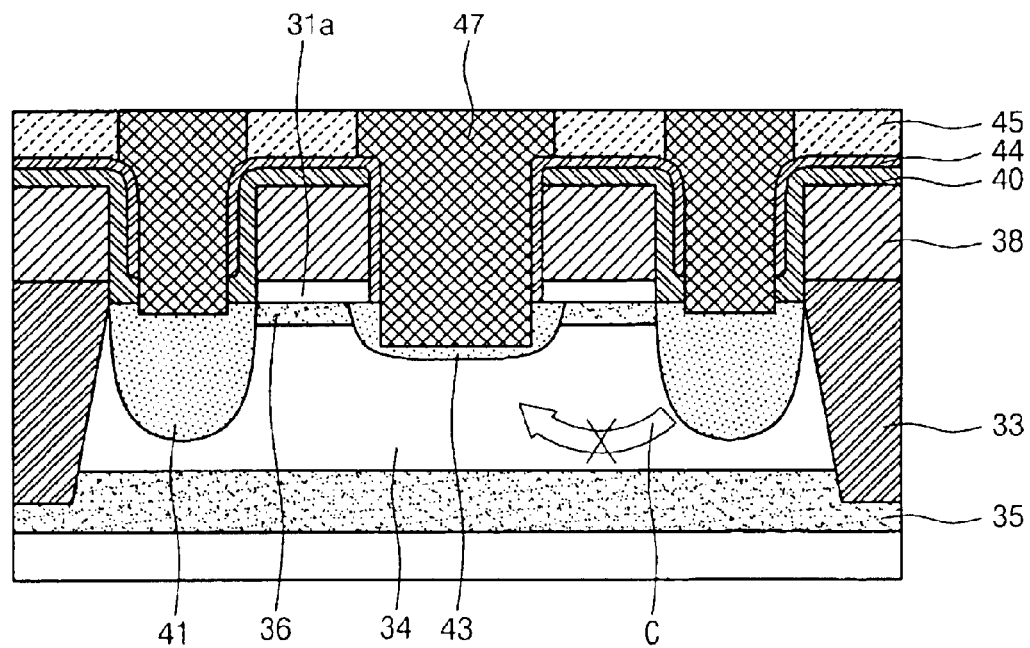
FIG. 2 is a sectional view illustrating a structure of a DRAM cell including independent and asymmetric source/drain regions according to a preferred embodiment of the invention.

FIG. 2 is a sectional view illustrating a structure of a DRAM cell including independent and asymmetric source/drain regions according to a preferred embodiment of the invention. As shown in FIG. 2, a cell active region is defined by a device isolation film 33, which is formed in a proper area of the semiconductor substrate. In the cell active region of the semiconductor substrate, a pad oxide film 31, a gate oxide film 31a, a channel layer 36, a well region 34 and a field stop layer 35 are sequentially formed on the surface of the semiconductor substrate. Several gates 38 are formed in an upper portion of the semiconductor substrate, source junctions 43 and a drain junction 43 are respectively formed between the gates 38 inside the semiconductor substrate. Further, each of a source spacer 40 and a drain spacer 44 is formed covering upper and lateral faces of the gates 38. An interlayer insulation film 45 is formed on the source and drain spacers 40 and 44. Contact plugs 47 respectively contact with the source and drain junctions 41 and 43.

In particular, the source and drain junctions 41 and 43 have an independent and asymmetric lateral configurations. In addition, the spacers 40 and 44 adjacent to the source and drain junctions 41 and 43 are also asymmetric in configuration and thickness. Generally, the source junctions 41 preferably have a thick and wide circular lateral configuration and thus are under a low value of electric field in order to connect the source junctions 41 with capacitor nodes and store electric charge in capacitors for a long time,. On the contrary, the drain junctions 43 can operate substantially free from the influence of junction leakage current as long as they are electrically connected with the source regions in an efficient manner via bit lines.

Therefore, the source junctions 41 are formed thick and the drain junctions 43 are formed thin to have the asymmetric configuration, thereby preventing creation of leakage current owing to punch-through (as indicated with an arrow C in FIG. 2). Thus, it is unnecessary to form a conventional ion injection layer for restraining punch-through. Also, a relatively low value of electric field can be applied to the junctions, thereby prolonging refresh time. Further, formation of the relatively thick spacer 40 adjacent to the source junctions 41 can decrease Gate Induced Drain Leakage (GIDL) while further reducing electric field.

The DRAM cell as set forth above will be obtained according a fabrication process as follows. The structure of the DRAM cell will also become clearer from the following fabrication process.

Figure 3:
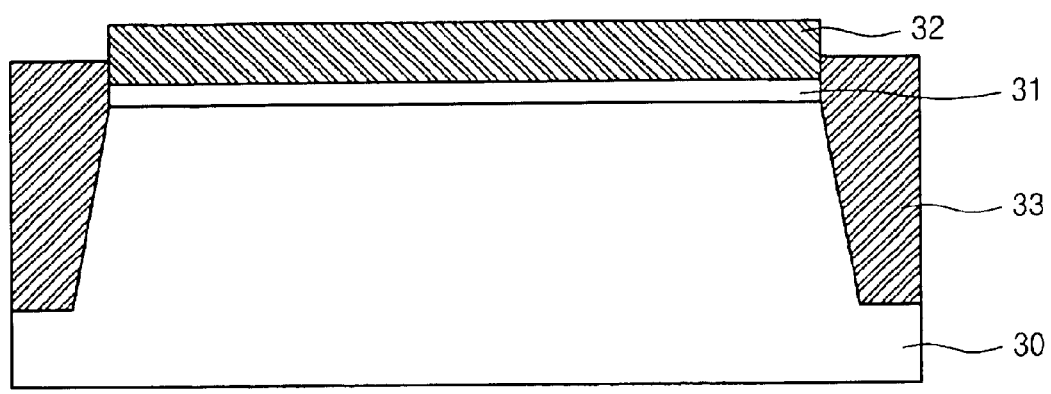
Figure 4:
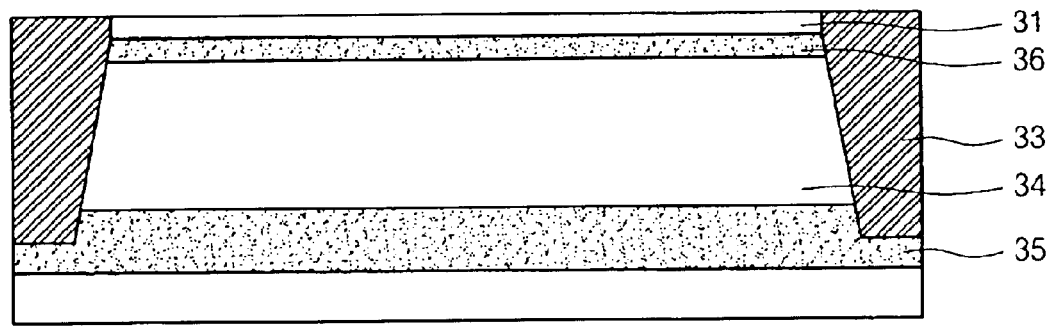
Figure 5:
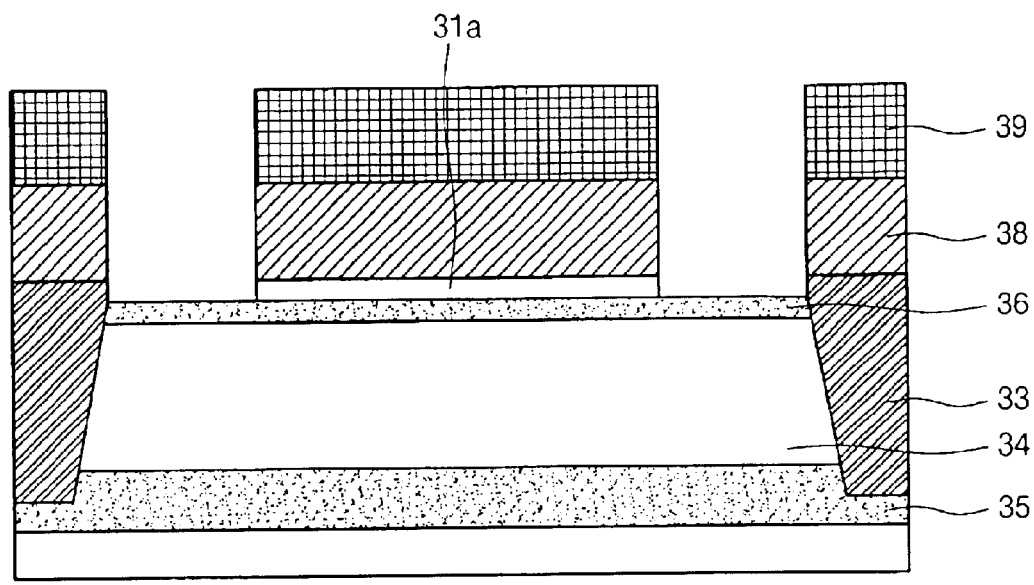
Figure 6:
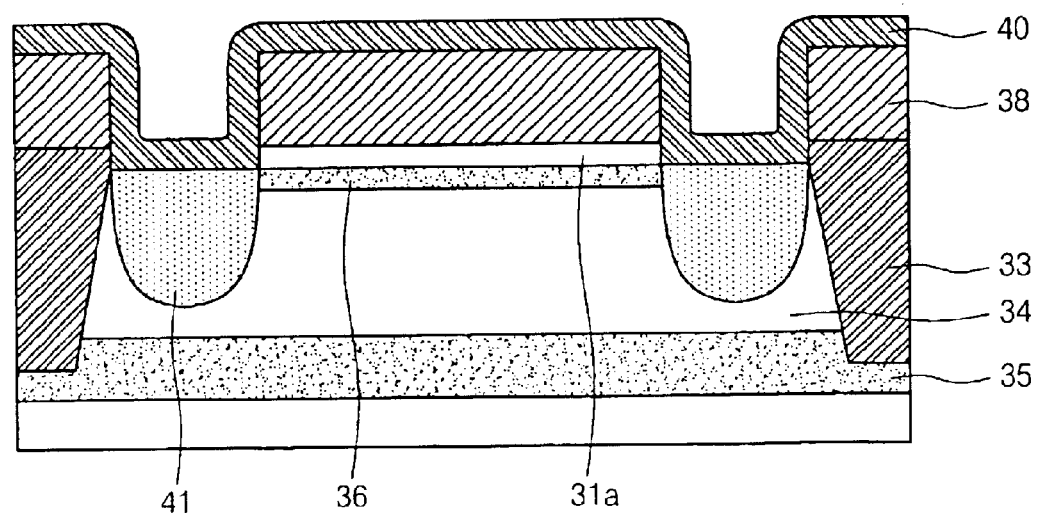
Figure 7:
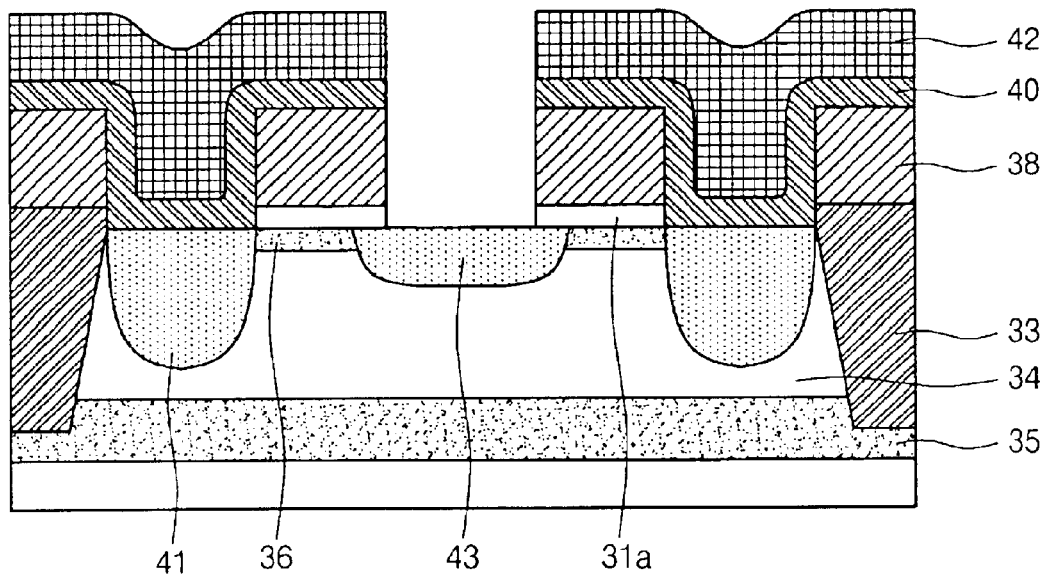
Figure 8:
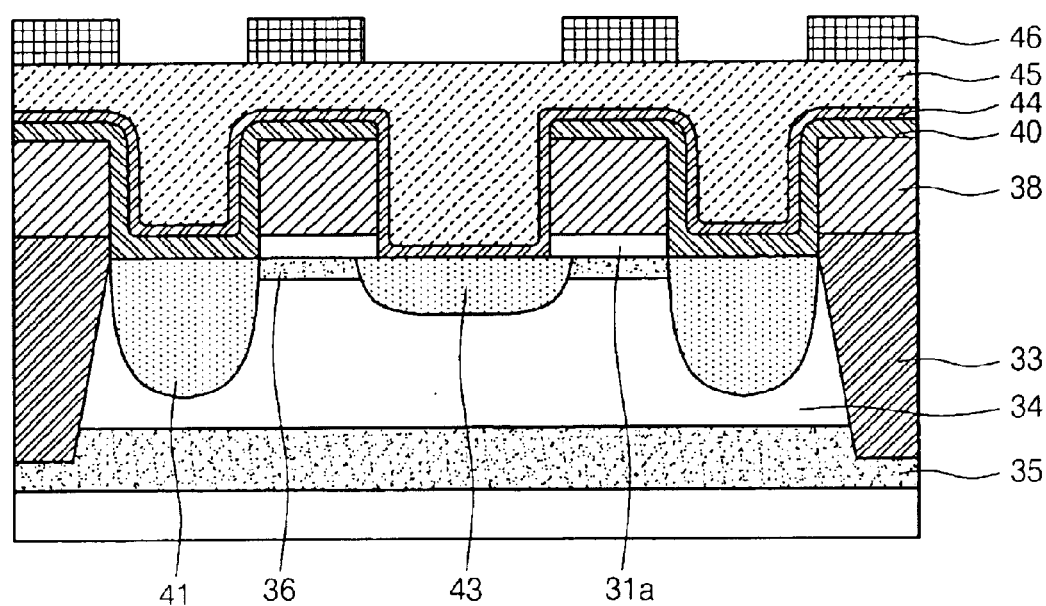
Figure 9:
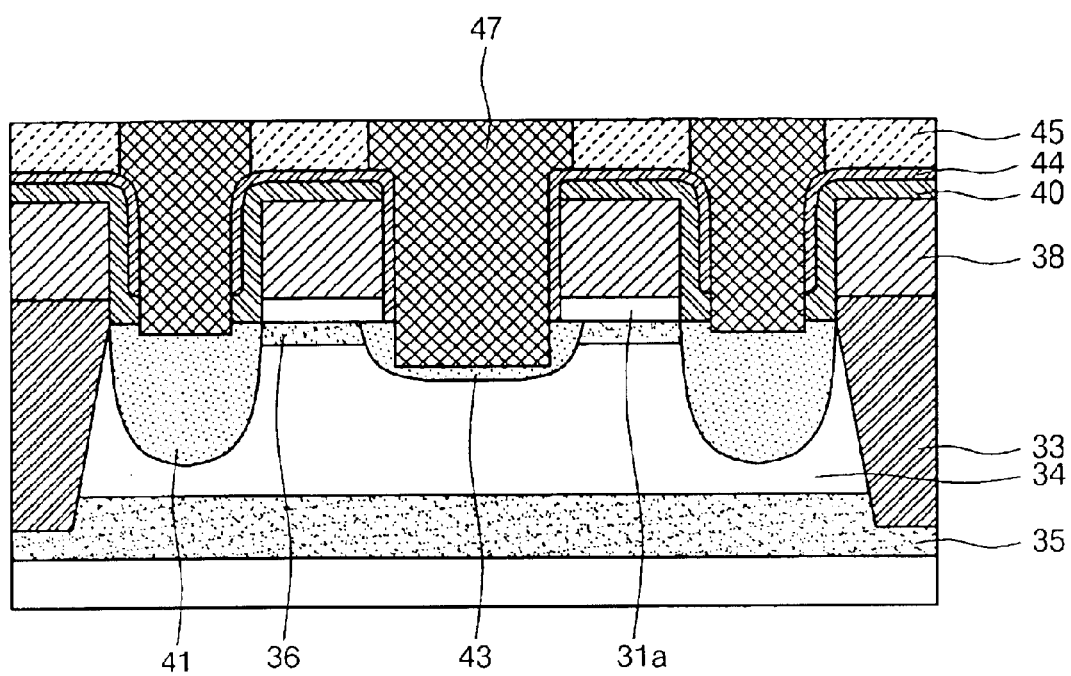

FIGS. 3 to 9 are sectional views illustrating a fabrication process of the DRAM cell shown in FIG. 2, in which: FIG. 3 shows a step of forming a device isolation film, FIG. 4 shows a step of injecting well ion, FIG. 5 shows a step of forming first gates, FIG. 6 shows a step of forming source junctions, FIG. 7 shows a step of forming second gates and a drain junction, and FIGS. 8 and 9 show steps for forming plugs.

As shown in FIG. 3, a pad oxide film 31 and a pad nitride film 32 are formed on a semiconductor substrate 30 via deposition. Proper areas of the pad oxide film 31, the pad nitride film 32 and the semiconductor substrate 30 are etched to form a device isolation region using a device isolation mask (not shown). In sequence, an oxide film is deposited and then polished to form a device isolation film 33 in the device isolation region.

After the pad nitride film is removed, as shown in FIG. 4, well ion is injected using a well mask (not shown) to form a well region 34 inside the semiconductor substrate. Via further ion injection, a field stop layer 35 is formed at a specific depth inside the semiconductor substrate and then a channel layer 36 is formed in the vicinity of an upper surface of the semiconductor substrate. In this circumstance, it is not necessary to form a conventional ion injection layer for restraining punch-through.

As shown in FIG. 5, a gate oxide film 31a is formed on the semiconductor substrate via thermal oxidation, and gate material is deposited on the entire surface of the semiconductor substrate. Then, the gate material is selectively etched using a first gate mask 39 to form gates 38. The first gate mask 39 exposes only portions of the gate material corresponding to source regions, in which the two gates 38 formed via the first gate mask 39 are connected into one.

After the first gate mask is removed, as shown in FIG. 6, a source spacer 40 is deposited on the entire surface of a resultant structure. Then, source junctions 41 are formed via ion injection. The source junctions 41 have a smooth and thick lateral configuration to keep electric charge for a long time period. The source spacer 40 is deposited thick and a high value of ion injection energy is applied to form the source junctions 41 so that GIDL is decreased via minimization of overlapping of the source junctions 41 with the gates 38.

As shown in FIG. 7, the source spacer 40 and the gates 38 are selectively etched using a second mask 42, and ion injection is performed to form a drain junction 43. Unlike the first gate mask, the second gate mask 42 exposes only a portion of the gate material corresponding to a drain region without exposing the source regions. The drain junction 43 is formed relatively thin and more highly concentrated in respect to the source junctions 41.

After the second gate mask is removed, as shown in FIG. 8, a drain spacer 44 is deposited on the entire surface of the resultant structure. An interlayer insulation film 45 is deposited on the resultant structure and then annealed. The interlayer insulation film 45 and the spacers 40 and 44 are selectively etched to expose the source/drain junctions 41 and 43 using a contact mask 46. The drain spacer 44 is relatively thin compared to the previously deposited source spacer 40.

As shown in FIG. 9, after the contact mask is removed, plug material is deposited on the resultant structure and polished thereby forming contact plugs 47, which respectively contact with the source/drain junctions 41 and 43.

According to the DRAM cell of the invention as set forth above, the source/drain junctions have an asymmetric configuration via separate ion injection steps independent from each other, thereby preventing leakage current due to punch-through. Also it is not necessary to form an ion injection layer for restraining punch-through, and a relatively low value of electric field is applied to the junctions to prolong refresh time. Further, the relatively thick spacer can be formed adjacent to the source regions thereby decreasing GIDL and further reducing electric field.

Although the preferred embodiment of the present invention has been described in the specification and drawing and specific terms have been used, it will not be understood that they are used for illustrative purposes to more readily explain the features of the invention rather than restricting the scope of the invention. Those skilled in the art will appreciate that various modifications, additions and substitutions are possible, without departing from the scope and spirit of the invention as disclosed in the accompanying claims.

What is claimed is:

1. A DRAM cell comprising:
    a device isolation film for defining en active region on a semiconductor substrate;
    a well region formed inside the semiconductor substrate corresponding to the active region;
    a plurality of channel layers formed in selected portions of the well region;
    a field stop layer underlying the well region in the substrate;
    a plurality of gates formed on the channel layers;
    source and drain junctions respectively formed between the gates inside the semiconductor substrate, the source and drain junctions having an asymmetric junction structure;
    a source spacer formed on the top surface of the gate and a selected portion of lateral surface of the gate adjacent the source junction and contacting the source junction;
    a drain spacer formed on the surfaces of the source spacer and directly on the side surface of the gate adjacent the drain junction, the drain spacer contacting the drain junction, wherein the source spacer is thicker than the drain spacer, and
    contact plugs respectively contacting with the source and drain junctions.

2. A fabrication method of a DRAM cell comprising the following steps of:
    forming a device isolation film for defining an active region on a semiconductor substrate;
    forming a well region inside the semiconductor substrate corresponding to the active region;
    after forming the well region, depositing a gate material on the resultant structure and forming gates using a first gate mask, which selectively exposes first portions of the resultant structure corresponding to the locations of source regions, wherein each gate is formed between two first portions;
    removing the first gate mask and forming source junctions according to the exposed first portions inside the semiconductor substrate so that the source junctions extend into the active region to a predetermined depth;
    after removing the first gate mask and forming the source junctions, depositing a source spacer on the resultant structure;
    etching a selected portion in the middle of two source junctions using the second gate mask, which selectively exposes a second portion of the resultant structure removing the layer of source spacer and the gate in the selected portion corresponding to the location of a drain region between two source junctions;
    forming a drain junction according to the second portion inside the semiconductor substrate so that the drain junction extends into the active region at a depth less than the predetermined depth of the source junctions;
    removing the second gate mask,
    after removing the second gate mask, depositing a drain spacer relatively thinner then the source spacer on the entire surface of a resultant structure;
    after depositing the drain spacer, depositing an interlayer insulation film on the resultant surface;
    selectively etching the interlayer insulation film, the drain layer, and the source layer to expose the source junctions;
    selectively etching the interlayer insulation film and the drain layer to expose the drain junction; and
    forming contact plugs respectively contacting with the source junctions and drain junction.

3. A fabrication method of a DRAM cell in accordance with claim 2, after the step of forming the well region, further comprising the step of:
    forming the field stop layer at a proper depth inside the semiconductor substrate and a channel layer in the vicinity of the semiconductor substrate.

* * * * *